United States Patent
Fujii et al.

(10) Patent No.: US 8,053,677 B2
(45) Date of Patent: Nov. 8, 2011

(54) ELECTRONIC APPARATUS AND METHOD OF MANUFACTURING THE SAME, AND WIRING SUBSTRATE AND METHOD OF MANUFACTURING THE SAME

(75) Inventors: Tomoharu Fujii, Nagano (JP); Yukiharu Takeuchi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 229 days.

(21) Appl. No.: 12/342,823

(22) Filed: Dec. 23, 2008

(65) Prior Publication Data

US 2009/0166072 A1     Jul. 2, 2009

(30) Foreign Application Priority Data

Dec. 27, 2007    (JP) ................................. 2007-335691

(51) Int. Cl.
     *H05K 1/16*      (2006.01)
(52) U.S. Cl. ........................................................ 174/260
(58) Field of Classification Search .................. 174/252, 174/260; 257/713, 717–720, 796
See application file for complete search history.

(56) References Cited

U.S. PATENT DOCUMENTS

2005/0029666 A1*   2/2005   Kurihara et al. ............... 257/772

FOREIGN PATENT DOCUMENTS

| JP | 2000-91717 | 3/2000 |
| JP | 2007-266443 | 10/2007 |

OTHER PUBLICATIONS

Machine Translation of JP 2007-266443 A (Oct. 11, 2007), Shinko Electric IND Co Ltd.*

* cited by examiner

*Primary Examiner* — Jeremy Norris
*Assistant Examiner* — Tremesha S Willis
(74) *Attorney, Agent, or Firm* — Drinker Biddle & Reath LLP (57) ABSTRACT

An electronic apparatus includes a multilayer wiring structure having insulating layers and wiring layers which are stacked and having a surface on which an electronic component is mounted, a dipole antenna formed on a surface 13A of the multilayer wiring structure, a radiating plate disposed on the surface together with the dipole antenna, and a radiating path formed in the multilayer wiring structure and serving to transfer a heat generated in the electronic component to the radiating plate.

11 Claims, 12 Drawing Sheets

ELECTRONIC APPARATUS AND METHOD OF MANUFACTURING THE SAME, AND WIRING SUBSTRATE AND METHOD OF MANUFACTURING THE SAME

TECHNICAL FIELD

The present disclosure relates to an electronic apparatus and a method of manufacturing the electronic apparatus, and a wiring substrate and a method of manufacturing the wiring substrate. More particularly, the present disclosure relates to an electronic apparatus having a passive component and a method of manufacturing the electronic apparatus, and a wiring substrate and a method of manufacturing the wiring substrate.

RELATED ART

With a reduction in a size of a wireless communicating apparatus in recent years, it is desirable to reduce a size of a semiconductor device to be mounted on the wireless communicating apparatus. The semiconductor device having a size reduced includes a semiconductor device 300 shown in FIG. 1, for example. The semiconductor device 300 shown in FIG. 1 has a wiring substrate 301, electronic components 302 and 303, a metal plate 308 and a slot antenna 310. The wiring substrate 301 has a core substrate 305, a first multilayer wiring structure 306 and a second multilayer wiring structure 307.

Figure 1:
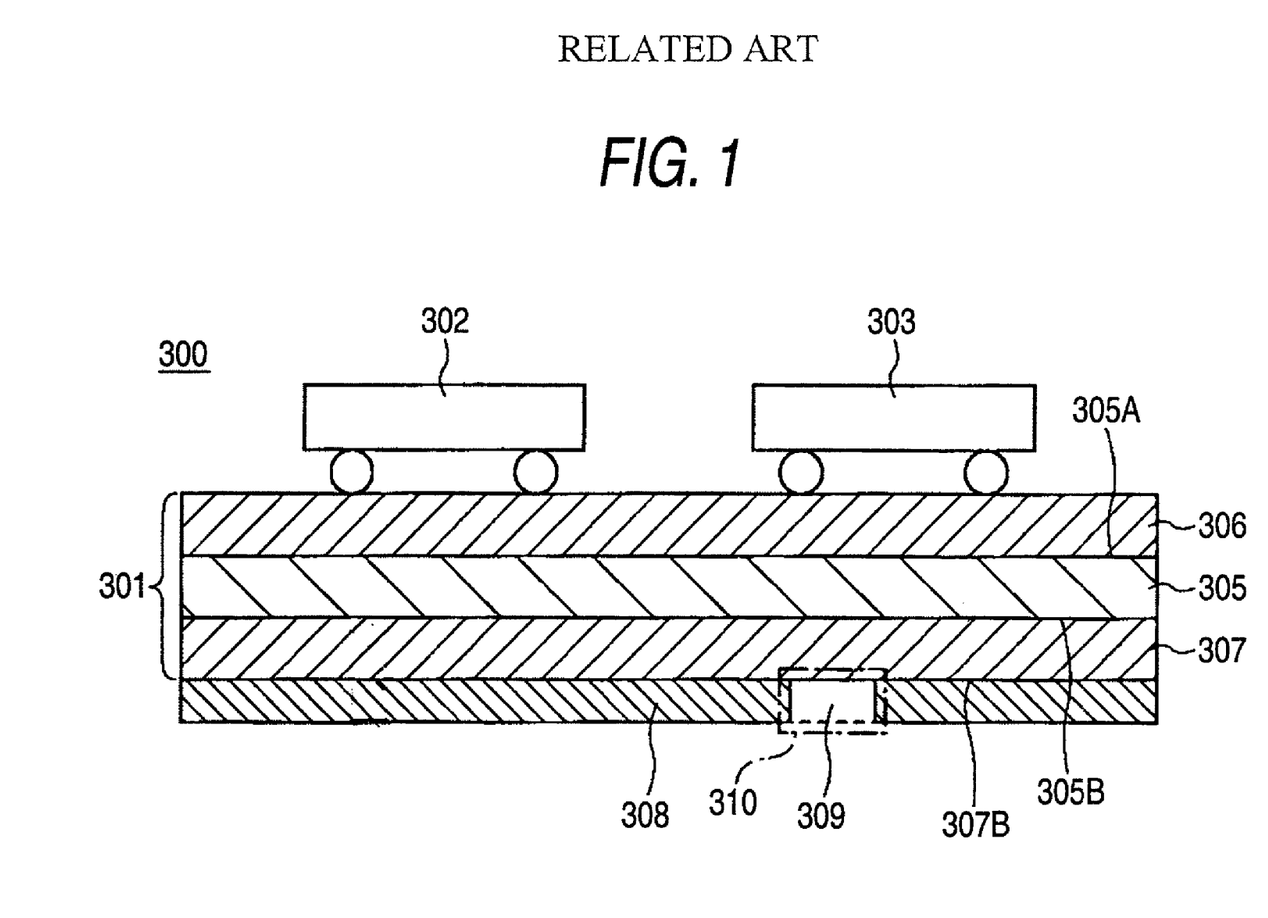
FIG. 1 is a sectional view showing a related-art semiconductor device.

The first multilayer wiring structure 306 has a structure in which insulating layers and wiring patterns (not shown) are stacked, and is provided on an upper surface 305A of the core substrate 305. The second multilayer wiring structure 307 has a structure in which insulating layers and wiring patterns (not shown) are stacked, and is provided on a lower surface 305B of the core substrate 305. The wiring pattern (not shown) of the second multilayer wiring structure 307 is electrically connected to the wiring pattern (not shown) of the first multilayer wiring structure 306 through a via (not shown) provided on the core substrate 305.

The metal plate 308 is provided on a surface 307B of the second multilayer wiring structure 307. The metal plate 308 is plate-shaped and is set to have a ground potential. The slot antenna 310 is provided on the metal plate 308. The slot antenna 310 is constituted by a through groove 309 provided on the metal plate 308, and the metal plate 308 corresponding to a sidewall of the through groove 309.

The electronic components 302 and 303 are electrically connected to the wiring pattern (not shown) of the first multilayer wiring structure 306. For the electronic component 302, an RFIC (a circuit element for generating a signal) can be used, for example. For the electronic component 303, a control circuit element for controlling the signal sent from the RFIC can be used, for example.

Thus, the electronic components 302 and 303 are connected to one of surfaces of the wiring substrate 301, and the slot antenna is provided on the other surface of the wiring substrate 301. As compared with the case in which the electronic components 302 and 303 and the slot antenna 310 are provided on the same plane of the wiring substrate 301, consequently, it is possible to reduce a size in a planar direction of the wiring substrate 301. Therefore, it is possible to reduce a size of the semiconductor device 300 (for example, see Patent Document 1).

The wiring substrate 301 is manufactured by forming the first and second multilayer wiring structures 306 and 307 on both of the surfaces 305A and 305B of the core substrate 305 through a build-up process. In a related-art method of manufacturing the wiring substrate 301, however, it is hard to enhance a productivity of the wiring substrate 301. For this reason, there is a problem in that a manufacturing cost of the wiring substrate 301 cannot be reduced. Consequently, there is a problem in that a manufacturing cost of the semiconductor device 300 is increased.

As a method of manufacturing a semiconductor device which can cut a manufacturing cost down while reducing a size, therefore, there have been proposed a semiconductor device and a method of manufacturing the semiconductor device disclosed in Patent Document 2.

[Patent Document 1]Japanese Patent Unexamined Publication No. 2000-091717 Publication

[Patent Document 2]Japanese Patent Unexamined Publication No. 2007-266443 Publication According to the semiconductor device and the method of manufacturing the semiconductor device which have been disclosed in the Patent Document 2, a metal plate serving as a support plate in a formation of a multilayer wiring structure is patterned to form an antenna. Consequently, it is not necessary to provide a step of removing the metal plate after forming the multilayer wiring structure. Therefore, it is possible to decrease the number of the steps of manufacturing a wiring substrate. Consequently, it is possible to reduce a manufacturing cost of the semiconductor device.

An electronic component (a semiconductor chip) to be provided on a semiconductor device having an antenna is generally radio frequency compatible and many electronic components have a large amount of heat generation. However, the semiconductor device disclosed in the cited reference 2 does not take a countermeasure against a heat generated by the electronic component. For this reason, there is a problem in that the heat generated by the electronic component cannot be radiated efficiently.

SUMMARY

Exemplary embodiments of the present invention provide an electronic apparatus and a method of manufacturing the electronic apparatus, and a wiring substrate and a method of manufacturing the wiring substrate which can enhance a radiation efficiency while reducing a manufacturing cost.

A first aspect of the invention is directed to an electronic apparatus including:

a multilayer wiring structure having an insulating layer and a wiring layer which are stacked;

an electronic component provided on one of surfaces of the multilayer wiring structure;

a passive component formed on the other surface at an opposite side to the one of the surfaces of the multilayer wiring structure;

a radiating member formed on the other surface of the multilayer wiring structure; and a radiating path formed in the multilayer wiring structure, having one of ends which is thermally connected to the radiating member, and the other end which is thermally connected to the electronic component.

A second aspect of the invention is directed to a method of manufacturing an electronic apparatus including:

a multilayer wiring structure forming step of sequentially providing an insulating layer, a wiring via and a wiring on a metal plate, thereby forming a multilayer wiring structure;

a metal plate processing step of patterning the metal plate to form a passive component; and a mounting step of mounting an electronic component on a surface at an opposite side to a surface of the multilayer wiring structure on which the passive component is formed, wherein a radiating via forming a radiating path is simultaneously formed together with the wiring and the wiring via at the multilayer wiring structure forming step, and a radiating plate is simultaneously formed from the metal plate together with the passive component at the metal plate processing step.

In the invention, furthermore, the method may include: a thermal bump forming step of forming a thermal bump for radiation on the surface at an opposite side to a surface of the multilayer wiring structure on which the passive component is formed, wherein the electronic component is thermally connected to the radiating path via the thermal bump at the mounting step.

A third aspect of the invention is directed to a wiring substrate, including:

a multilayer wiring structure having an insulating layer and a wiring layer which are stacked and having one of surfaces on which an electronic component is mounted;

a passive component formed on the other surface at an opposite side to the one of the surfaces of the multilayer wiring structure;

a radiating member formed on the other surface of the multilayer wiring structure; and a radiating path formed in the multilayer wiring structure, having one of ends which is thermally connected to the radiating member, and the other end which is thermally connected to the electronic component.

A fourth aspect of the invention is directed to a method of manufacturing a wiring substrate including:

a multilayer wiring structure forming step of sequentially providing an insulating layer, a wiring via and a wiring on a metal plate, thereby forming a multilayer wiring structure; and a metal plate processing step of patterning the metal plate to form a passive component, wherein a radiating via forming a radiating path is simultaneously formed together with the wiring and the wiring via at the multilayer wiring structure forming step, and a radiating plate is simultaneously formed from the metal plate together with the passive component at the metal plate processing step.

According to the invention, the radiating member is thermally connected to the electronic component through the radiating path. Therefore, it is possible to efficiently radiate the heat generated by the electronic component. Moreover, the radiating member is disposed together with the passive component on the surface at the opposite side to the surface on which the electronic component of the multilayer wiring structure is provided. Therefore, it is possible to reduce the size of the electronic apparatus as compared with the structure in which all of them are formed on the same plane. In addition, the radiating member also functions as a reinforcing member for the multilayer wiring structure. Therefore, it is possible to increase a strength of the electronic apparatus.

Other features and advantages may be apparent from the following detailed description, the accompanying drawings and the claims.

DETAILED DESCRIPTION

Next, the best mode for carrying out the invention will be described with reference to the drawings.

Figure 2:
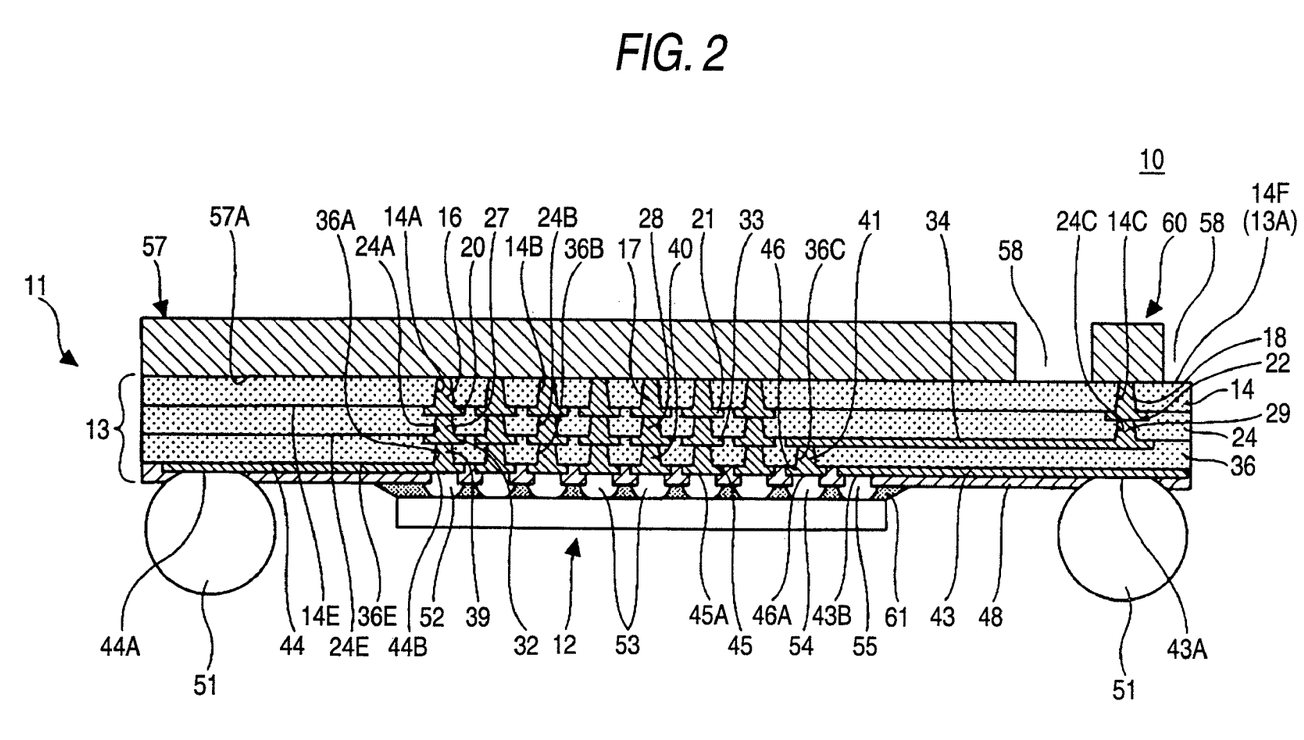
FIG. 2 is a sectional view showing a semiconductor device according to an embodiment of the invention.
Figure 3:
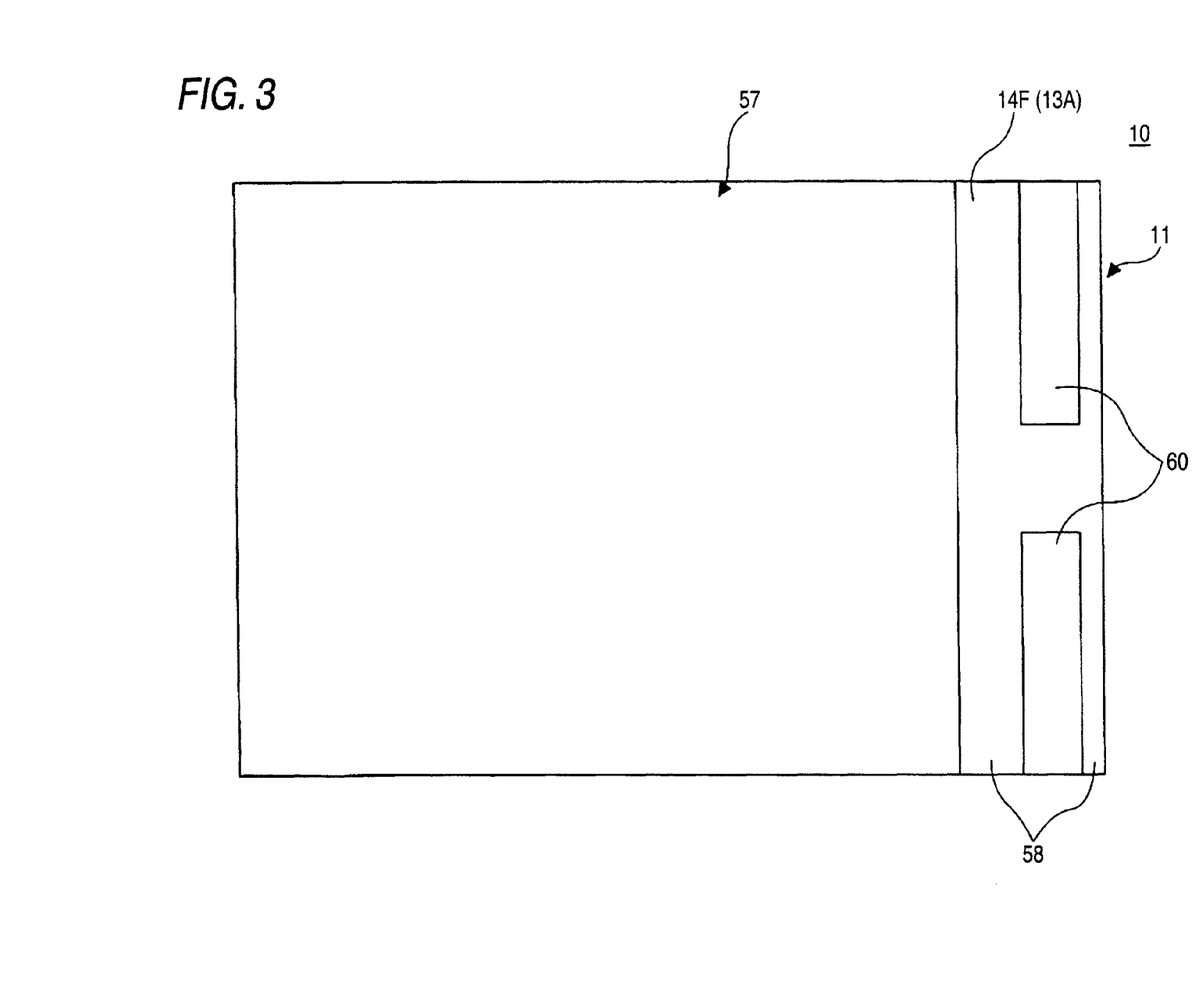
FIG. 3 is a view showing the semiconductor device illustrated in FIG. 2 as seen on a plane.

FIGS. 2 and 3 show an electronic apparatus 10 according to an embodiment of the invention. FIG. 2 is a sectional view showing the electronic apparatus 10 and FIG. 3 is a plan view showing the electronic apparatus 10. In the embodiment, description will be given by taking, as an example of an electronic apparatus, an electronic apparatus to be used in a wireless communicating apparatus.

The electronic apparatus 10 is roughly constituted by a wiring substrate 11 and an electronic component 12. The wiring substrate 11 is a so-called coreless substrate. The wiring substrate 11 has a multilayer wiring structure 13, a first external connecting terminal 51, second external connecting terminals 52 to 55, a radiating plate 57, and a dipole antenna 60 to be an antenna.

The multilayer wiring structure 13 has insulating layers 14, 24 and 36, first vias 16 to 18, first wirings 20 to 22, second vias 27 to 29, second wirings 32 to 34, third vias 39 to 41, third wirings to 46, and a protective film 48.

As will be described below, in each of the structures, the first to third vias 16, 27 and 39 and the first to third wirings 20, 32 and 44 function as ground wirings in cooperation with each other. Moreover, the first to third vias 17, 28 and 40 (radiating vias) and the first to third wirings 21, 33 and 45 (radiating wirings) function as a radiating path for radiating a heat generated in the electronic component 12 to the radiating plate 57 in cooperation with each other. Furthermore, the first to third vias 18, 29 and 41 and the first to third wirings 22, 34 and 46 function as a signal supply line for transmitting a signal to the dipole antenna 60 in cooperation with each other.

The insulating layer 14 is provided to cover a surface 57A of the radiating plate 57. For the insulating layer 14, it is possible to use an epoxy based resin or a polyimide based resin, for example. Moreover, opening portions 14A to 14C are formed in the insulating layer 14. The opening portions 14A and 14B are formed to expose the surface 57A of the radiating plate 57, and the opening portion 14C is formed to expose a surface 60A (see FIG. 10) of the dipole antenna 60.

The first via 16 is formed in the opening portion 14A. Furthermore, the first via 17 is formed in the opening portion 14B. The first via 16 is electrically connected to the radiating plate 57, and the first via 17 is thermally connected to the radiating plate 57. In addition, the first via 18 is formed in the opening portion 14C. The first via 18 is electrically connected to the dipole antenna 60. For materials of the first vias 16 to 18, it is possible to use a conductive metal having a high thermal conductivity, for example, Cu.

The first wirings 20 to 22 are formed on a surface 14E of the insulating layer 14. The first wiring 20 is constituted integrally with the first via 16. Therefore, the first wiring 20 is electrically connected to the radiating plate 57 through the first via 16. The first wiring 21 is constituted integrally with the first via 17. Accordingly, the first wiring 21 is thermally connected to the radiating plate 57 through the first via 17. The first wiring 22 is constituted integrally with the first via 18. Accordingly, the first wiring 22 is electrically connected to the dipole antenna 60 through the first via 18. For materials of the first wirings 20 to 22, it is possible to use a conductive metal having a high thermal conductivity, for example, Cu. insulating layer 14 to cover the first wirings 20 to 22. The insulating layer 24 has an opening portion 24A for exposing a part of the first wiring 20, an opening portion 24B for exposing a part of the first wiring 21, and an opening portion 24C for exposing a part of the first wiring 22. For the insulating layer 24, it is possible to use a resin layer such as an epoxy based resin or a polyimide based resin.

The second via 27 is provided in the opening portion 24A and is electrically connected to the first wiring 20. The second via 28 is provided in the opening portion 24B. The second via 28 is thermally connected to the first wiring 21. The second via 29 is provided in the opening portion 24C. The second via 29 is electrically connected to the first wiring 22. For materials of the second vias 27 to 29, it is possible to use a conductive metal having a high thermal conductivity, for example, Cu.

The second wirings 32 to 34 are formed on a surface 24E of the insulating layer 24. The second wiring 32 is constituted integrally with the second via 27. The second wiring 33 is constituted integrally with the second via 28. The second wiring 34 is extended from a position of the second external connecting terminal 54 to that of the dipole antenna 60, and is constituted integrally with the second via 29 at an end on the dipole antenna 60 side. For materials of the second wirings 32 to 34, it is possible to use a conductive metal having a high thermal conductivity, for example, Cu.

The insulating layer 36 is provided on the surface 24E of the insulating layer 24 to cover the second wirings 32 to 34. The insulating layer 36 has an opening portion 36A for exposing a part of the second wiring 32, an opening portion 36B for exposing a part of the second wiring 33, and an opening portion 36C for exposing a part of the second wiring 34. For the insulating layer 36, it is possible to use a resin layer such as an epoxy based resin or a polyimide based resin.

The third via 39 is provided in the opening portion 36A. The third via 39 is electrically connected to the second wiring 32. The third via 40 is provided in the opening portion 36B. The third via is thermally connected to the second wiring 33. The third via is provided in the opening portion 36C. The third via 41 is electrically connected to the second wiring 34. For materials of the third vias 39 to 41, it is possible to use a conductive metal having a high thermal conductivity, for example, Cu.

The third wirings 43 to 46 are provided on a surface 36E of the insulating layer 36. The third wiring 43 is extended to be long from a position of the signal bump 55 to that of the first external connecting terminal 51. The third wiring 44 is extended from a position of the ground bump 52 to that of the first external connecting terminal 51, and an end on the ground bump 52 side (a right side in FIG. 2) is constituted integrally with the third via 39.

The third wiring 45 is constituted integrally with the third via 40. The third wiring 46 is constituted integrally with the third via 41. For materials of the third wirings 43 to 46, it is possible to use a conductive metal having a high thermal conductivity, for example, Cu.

The protective film 48 is provided on the surface 36E of the insulating layer 36 to cover the third wirings 43 to 46. The protective film 48 serves to protect the third wirings 43 to 46. A plurality of openings is formed on the protective film 48. Consequently, connecting portions 43A, 43B, 44A, 44B, 45A and 46A are formed.

The first external connecting terminal 51 is provided on the connecting portions 43A and 44A. The first external connecting terminal 51 serves to electrically connect the wiring substrate 11 to a mounting substrate such as a mother board (not shown). For example, a solder ball can be used for the first external connecting terminal 51.

The second external connecting terminal 52 is a grounding bump and is provided on the connecting portion 44B. The second external connecting terminal 52 is electrically connected to a pad for a ground (not shown) of the electronic component 12. Consequently, the electronic component 12 (the pad for a ground) is connected to the first external connecting terminal 51 through the third wiring 44, and furthermore, is electrically connected to the radiating plate 57 through the third via 39, the second wiring 32, the second via 27, the first wiring 20 and the first via 16. By the structure, the radiating plate 57 has a ground potential.

The second external connecting terminal 53 is a thermal bump and is provided on the connecting portion 45A. The second external connecting terminal 53 is thermally connected to a radiating dummy pad (not shown) formed in the electronic component 12. Accordingly, the electronic component 12 is thermally connected to the radiating plate 57 through the second external connecting terminal 53, the third wiring 45, the third via 40, the second wiring 33, the second via 28, the first wiring 21 and the first via 17. More specifically, the first via 17 (including the first wiring 21), the second via 28 (including the second wiring 33) and the third via 40 (including the third wiring 45) function as thermal vias for radiating the heat generated in the electronic component 12 to the radiating plate 57.

The second external connecting terminal 54 is a bump for an antenna and is provided on the connecting portion 46A. The second external connecting terminal 54 is connected to a pad for an antenna (not shown) of the electronic component 12. Accordingly, the electronic component 12 is electrically connected to the dipole antenna 60 through the second external connecting terminal 54, the third wiring 46, the third via 41, the second wiring 34, the second via 29, the first wiring 22 and the first via 18.

The second external connecting terminal 55 is a bump for a signal, and is connected to a pad for a signal of the electronic component 12 and is provided on the connecting portion 43B.

The second external connecting terminal 55 is electrically connected to the first external connecting terminal 51 through the third wiring 43.

The radiating plate 57 is provided to cover a surface 14F of the insulating layer 14. Moreover, the dipole antenna 60 is also provided on the surface 14F of the insulating layer 14.

FIG. 3 is a view showing the semiconductor device illustrated in FIG. 2 as seen on a plane. As shown in FIG. 3, the radiating plate 57 is formed widely on a first surface 13A of the multilayer wiring structure 13 (the surface 14F of the insulating layer 14) excluding a position in which the dipole antenna 60 is formed. More specifically, the radiating plate 57 occupies approximately 70 to 80% of a total area of the first surface 13A. Moreover, the position in which the dipole antenna 60 is formed is selected on an end of the first surface 13A (one end at a short side in the embodiment) and a region in which the radiating plate 57 is formed is not divided by the dipole antenna 60. Furthermore, a removing portion 58 is formed in the dipole antenna 60 so that the dipole antenna 60 is caused to take a shape of a predetermined antenna.

Returning to FIG. 2 again, the description will be continuously given. For example, the electronic component 12 is a radio frequency compatible semiconductor chip in which a structure of an RFIC (more specifically, a circuit for generating a signal) and a control circuit for controlling a signal sent from the RFIC are provided. The electronic component 12 has the pad for a ground which is connected to the second external connecting terminal 52, the dummy pad to be connected to the second external connecting terminal 53 serving as a thermal bump, the pad for an antenna which is connected to the second external connecting terminal 54, and the pad for a signal which is connected to the second external connecting terminal 55 (neither of the pads are shown) as described above. The electronic component 12 is connected to the wiring substrate 11 through the second external connecting terminals 52 to 55 by flip-chip bonding. Moreover, an underfill resin 61 is provided between the electronic component 12 and the wiring substrate 11 which are connected to each other by flip-chip bonding.

According to the electronic apparatus 10 in accordance with the embodiment, the dipole antenna 60 is provided on a surface of the multilayer wiring structure 13 on an opposite side to the surface to which the electronic component 12 is connected. As compared with the case in which the electronic component 12 and the dipole antenna 60 are provided on the same plane of the multilayer wiring structure 13, consequently, it is possible to reduce a size in a planar direction of the wiring substrate 11. Thus, it is possible to reduce the size of the electronic apparatus 10.

As described above, moreover, the electronic component 12 and the radiating plate 57 are thermally connected through the second external connecting terminal 53, the third wiring 45, the third via 40, the second wiring 33, the second via 28, the first wiring 21 and the first via 17 (a path for transferring a heat will be hereinafter referred to as a heat transfer path). Accordingly, the heat generated in the electronic component 12 is efficiently transferred to the radiating plate 57 through the heat transfer path and is discharged through the radiating plate 57. Accordingly, it is possible to efficiently discharge the heat generated in the electronic component 12.

In the embodiment, furthermore, the pads for a signal, an antenna, a power supply and a ground formed on the electronic component 12 are disposed in a peripheral shape and a plurality of heat transfer paths is formed therein. By the structure, therefore, it is possible to efficiently transfer the heat generated in the electronic component 12 to the radiating plate 57.

Moreover, the electronic component 12 and the radiating plate 57 are connected to the third wiring 44 and the external connecting terminal 51, and furthermore, are electrically connected to each other through the third via 39, the second wiring 32, the second via 27, the first wiring 20 and the first via 16. Accordingly, the radiating plate 57 is set to have a ground potential.

Furthermore, the dipole antenna 60 is formed in an end position of the first surface 13A on the multilayer wiring structure 13 (see FIG. 3). Moreover, the radiating plate 57 is formed in a large region of the first surface 13A. Accordingly, the second wiring (antenna wiring) 34 for supplying an antenna signal to the dipole antenna 60 and the radiating plate 57 are opposed to each other within a long range.

Accordingly, the radiating plate 57 and the antenna wiring 34 have a microstrip structure and can prevent a loss from being generated even if a radio frequency signal is sent to the second wiring (antenna wiring) 34. Furthermore, the radiating plate 57 is set to have the ground potential. Therefore, the radiating plate 57 also functions as a shield plate and can prevent a disturbance from entering the electronic component 12 from an outside and an electromagnetic wave generated in the electronic component 12 from influencing an external apparatus.

Furthermore, the radiating plate 57 is formed of a metal. Even if the multilayer wiring structure 13 is a so-called coreless substrate, therefore, it can be reinforced. Consequently, it is possible to enhance a mechanical strength of the electronic apparatus 10. Thus, it is possible to increase a reliability of the electronic apparatus 10.

While the description has been given by taking, as an example, the case in which the number of the layers provided in the multilayer wiring structure 13 (the number of the insulating layers and the wirings which are provided) is three in the embodiment, the number of the layers provided in the multilayer wiring structure 13 may be two or may be three or more.

Next, description will be given to a method of manufacturing a wiring substrate and an electronic apparatus according to an embodiment of the invention. In the following description of the manufacturing method, a method of manufacturing the electronic apparatus 10 shown in FIGS. 2 and 3 is taken as an example.

FIGS. 4 to 10 are views showing steps of manufacturing the wiring substrate 11 and the electronic apparatus 10. In FIGS. 4 to 10, the same components as those of the electronic apparatus 10 shown in FIGS. 2 and 3 have the same reference numerals and the description will be properly omitted.

Figure 4:
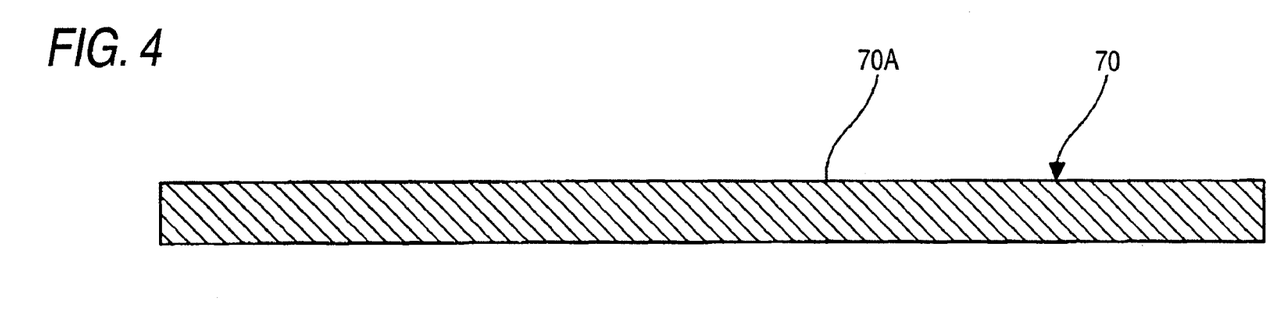
FIG. 4 is a view (No. 1) showing a step of manufacturing the semiconductor device according to the embodiment of the invention.

In order to manufacture the wiring substrate 11 and the electronic apparatus 10, a metal plate 70 serving as a support plate for forming a multilayer wiring structure is first prepared as shown in FIG. 4. A metal foil can be used as the metal plate 70, for example. A Cu foil can be used for the metal foil, for example, and a thickness thereof can be set to be 20 to 30 µm, for example.

Figure 5:
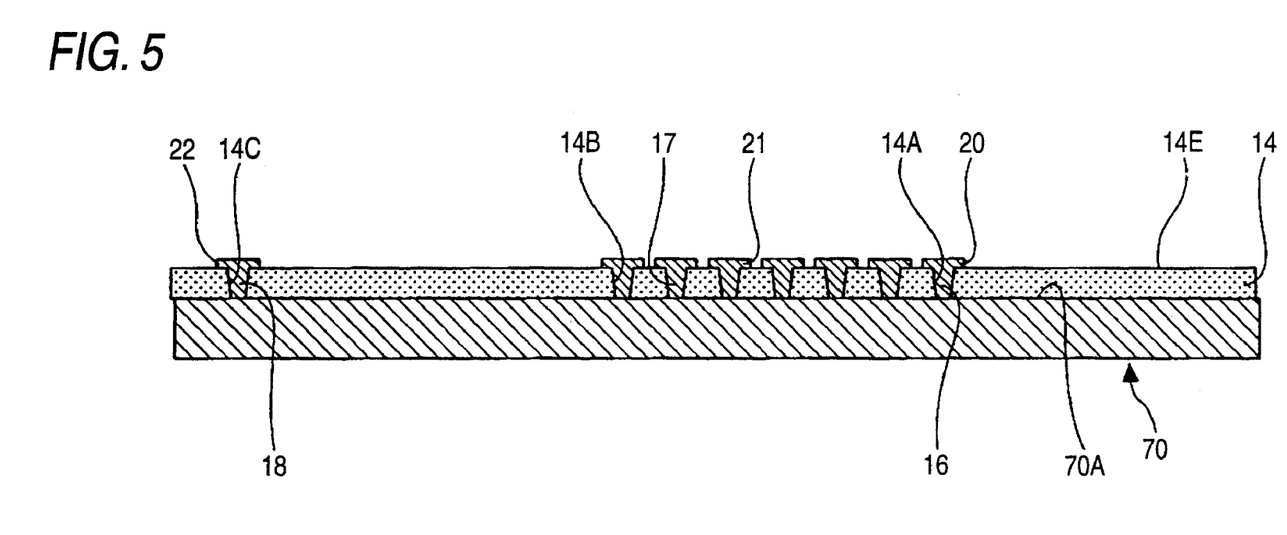
FIG. 5 is a view (No. 2) showing a step of manufacturing the semiconductor device according to the embodiment of the invention.

As shown in FIG. 5, subsequently, an insulating layer 14 having opening portions 14A to 14C is formed on a surface 70A of the metal plate 70, and first vias 16 to 18 and first wirings 20 to 22 are then formed.

More specifically, for example, a resin film is stuck to form a resin layer as the insulating layer 14 on the surface 70A of the metal plate 70 and the opening portions 14A to 14C are then formed by a laser processing. Next, a seed layer (not shown) is formed by electroless plating so as to cover the resin layer and a resist film having an opening portion for exposing only regions in which the first wirings 20 to 22 are formed is provided on the seed layer.

Subsequently, a conductive metal is deposited on the seed layer exposed from the opening portion by an electrolytic plating method using the seed layer as a feeding layer. Then, the resist film and the seed layer covered with the resist film are removed to form the first vias 16 to 18 and the first wirings 20 to 22. As a material of the resin layer, for example, it is possible to use an epoxy based resin or a polyimide based resin. As materials of the seed layer and the conductive metal, for example, it is possible to use Cu.

Figure 6:
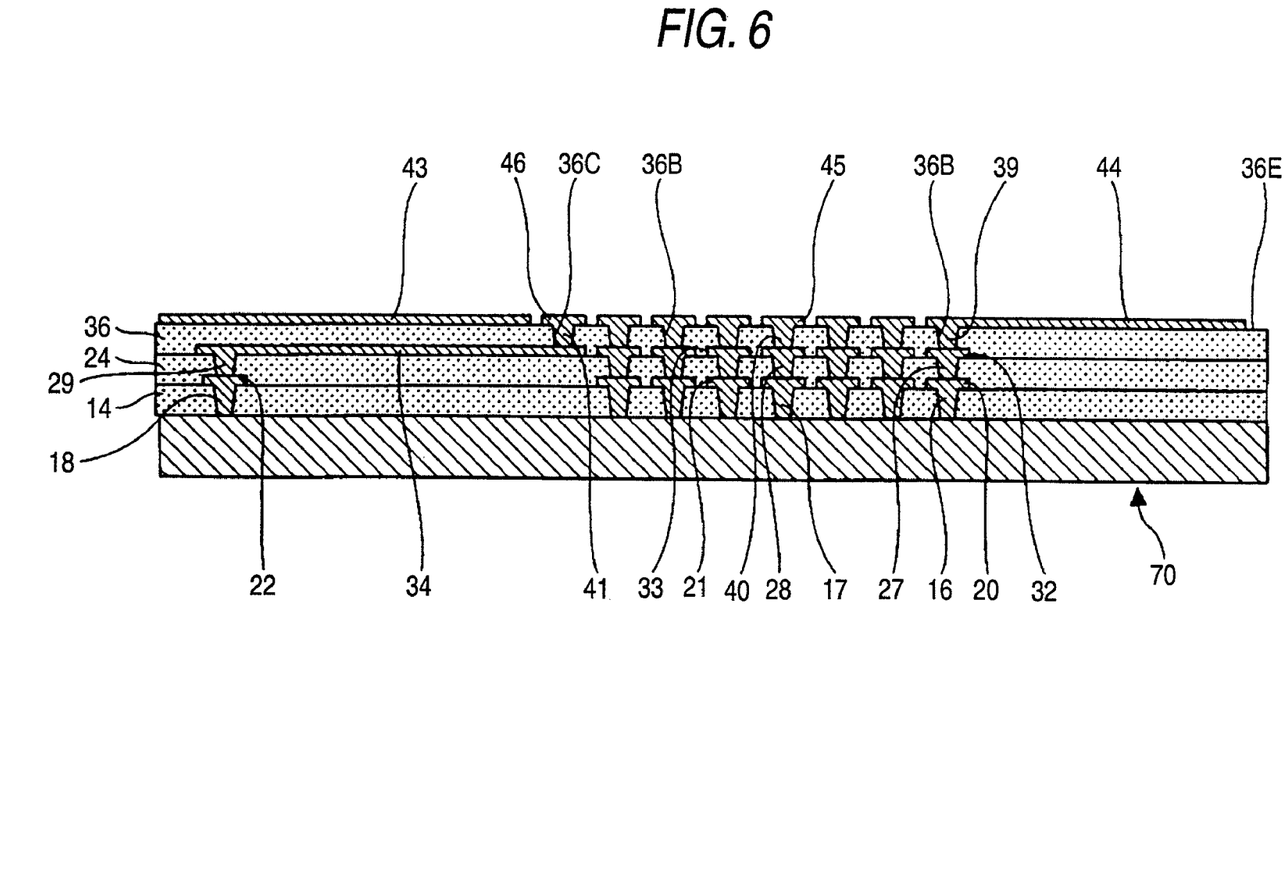
FIG. 6 is a view (No. 3) showing a step of manufacturing the semiconductor device according to the embodiment of the invention.

At the step shown in FIG. 6, next, insulating layers 24 and 36, second and third vias 27 to 29 and 39 to 41, and second and third wirings 32 to 34 and 43 to 46 are formed on the structure shown in FIG. 5 by the same method as the step illustrated in FIG. 5.

Figure 7:
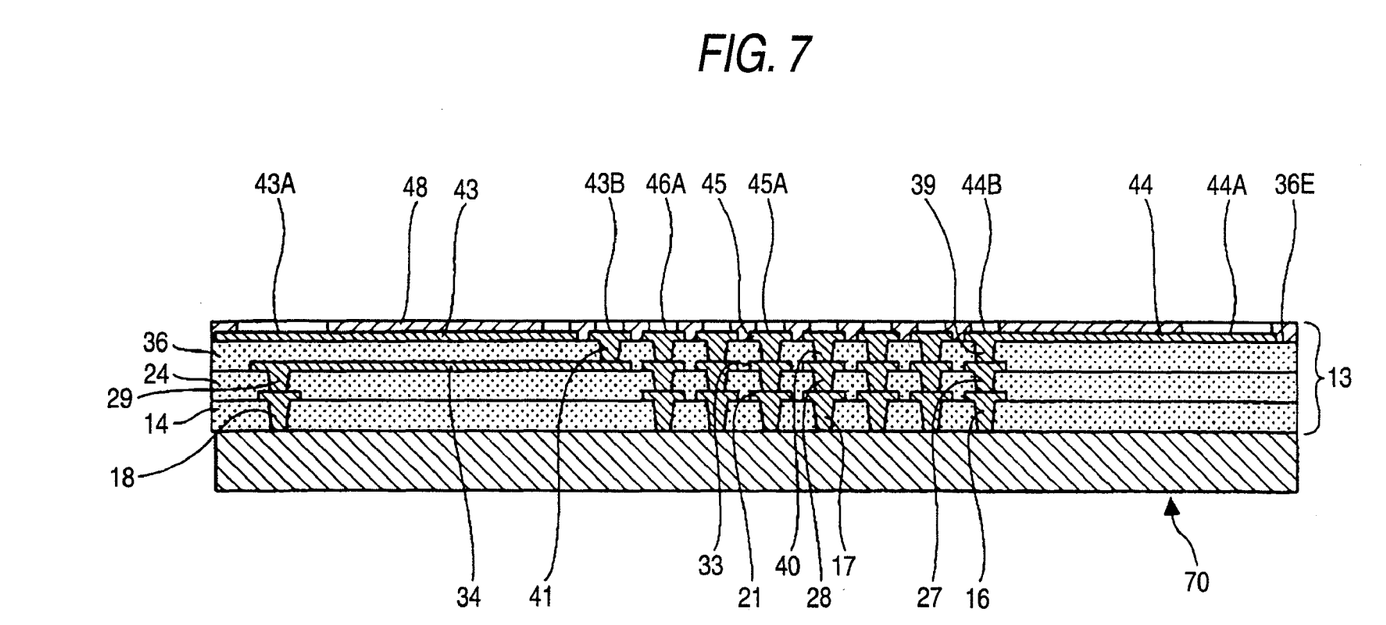
FIG. 7 is a view (No. 4) showing a step of manufacturing the semiconductor device according to the embodiment of the invention.

As shown in FIG. 7, then, a protective film 48 (a solder resist) having opening portions for exposing connecting portions 43A to 46A, 43B and 44B of the third wirings 43 to 46 is formed on the structure illustrated in FIG. 6. Consequently, a multilayer wiring structure 13 is formed. Moreover, the steps shown in FIGS. 5 to 7 correspond to a multilayer wiring structure forming process.

Figure 8:
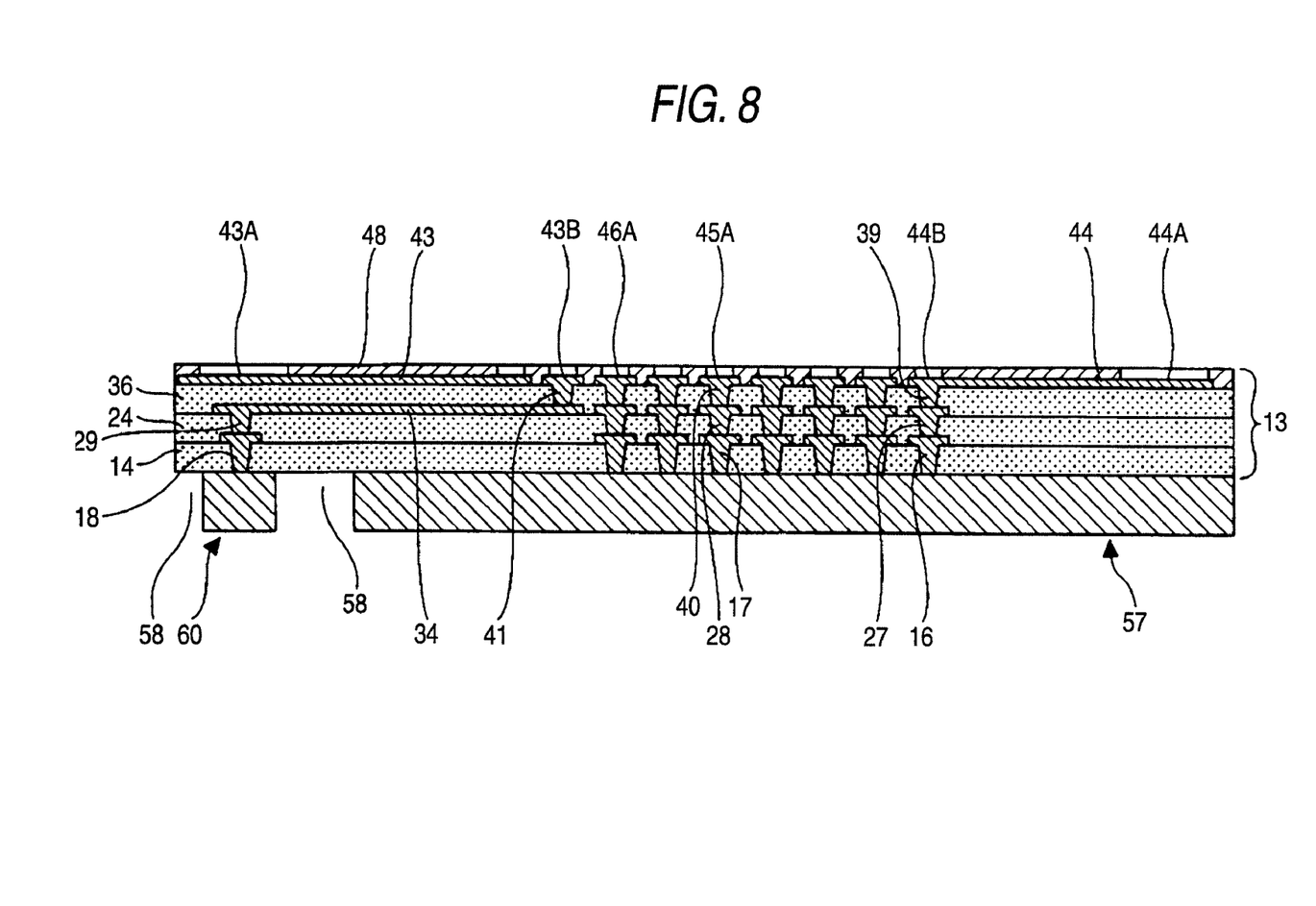
FIG. 8 is a view (No. 5) showing a step of manufacturing the semiconductor device according to the embodiment of the invention.

At the step shown in FIG. 8, thereafter, a removing portion 58 is formed on the metal plate 70. Consequently, a radiating plate 57 and a dipole antenna 60 which have the planar shapes shown in FIG. 3 are formed at the same time (a metal plate processing step). The removing portion 58 is formed by etching the metal plate 70, for example. For the etching, it is possible to use wet etching or dry etching. As a specific method, an etching resist is formed on the metal plate 70 and is subjected to patterning to have a predetermined shape corresponding to the radiating plate 57 and the dipole antenna 60, and is then used as a mask to carry out the etching. Consequently, the radiating plate 57 and the dipole antenna 60 are formed at the same time.

In the embodiment, thus, the metal plate 70 serving as the support plate for forming the multilayer wiring structure 13 is subjected to the patterning so that the radiating plate 57 and the dipole antenna 60 are formed at the same time. As compared with a method of newly forming the radiating plate 57 and the dipole antenna 60 after removing the metal plate 70, therefore, it is possible to reduce the number of the steps of manufacturing the wiring substrate 11. As compared with a method of separately forming the radiating plate 57 and the dipole antenna 60, furthermore, the radiating plate 57 and the dipole antenna 60 are formed at the same time in the embodiment. Therefore, it is possible to reduce the number of the manufacturing steps. According to the manufacturing method in accordance with the embodiment, consequently, it is possible to reduce a manufacturing cost of the wiring substrate 11.

Figure 9:
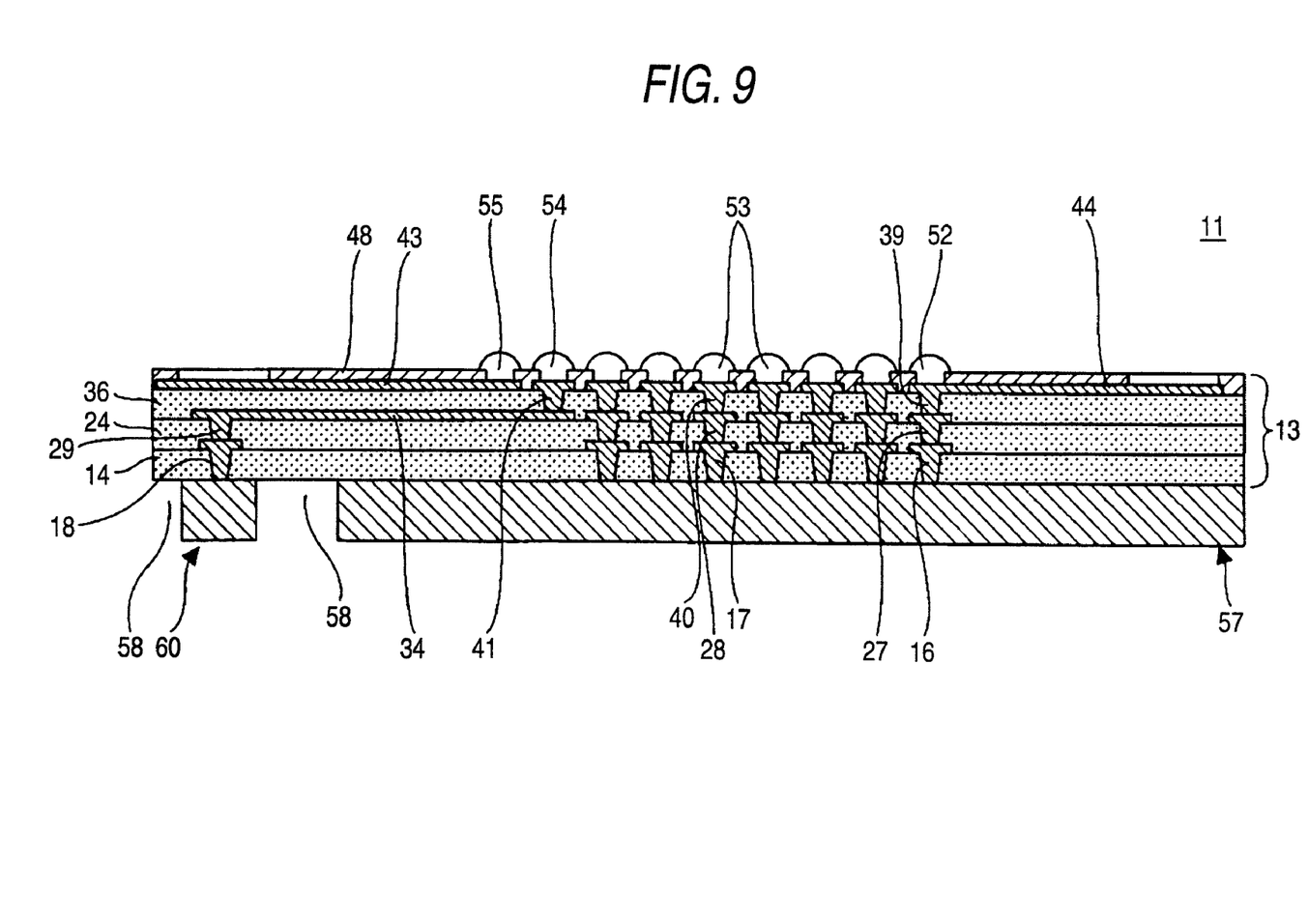
FIG. 9 is a view (No. 6) showing a step of manufacturing the semiconductor device according to the embodiment of the invention.

At a step shown in FIG. 9, subsequently, second external connecting terminals 52 to 55 are formed on the connecting portions 43B, 44B, 45A and 46A. Consequently, the wiring substrate 11 is formed. For the second external connecting terminals 52 to 55, it is possible to use a solder bump, for example. In the case in which the solder bump is used as the second external connecting terminals 52 to 55, moreover, the second external connecting terminals 52 to 55 can be formed by the Super Jufit method (registered trademark of Showa Denko K. K.), for example.

Figure 10:
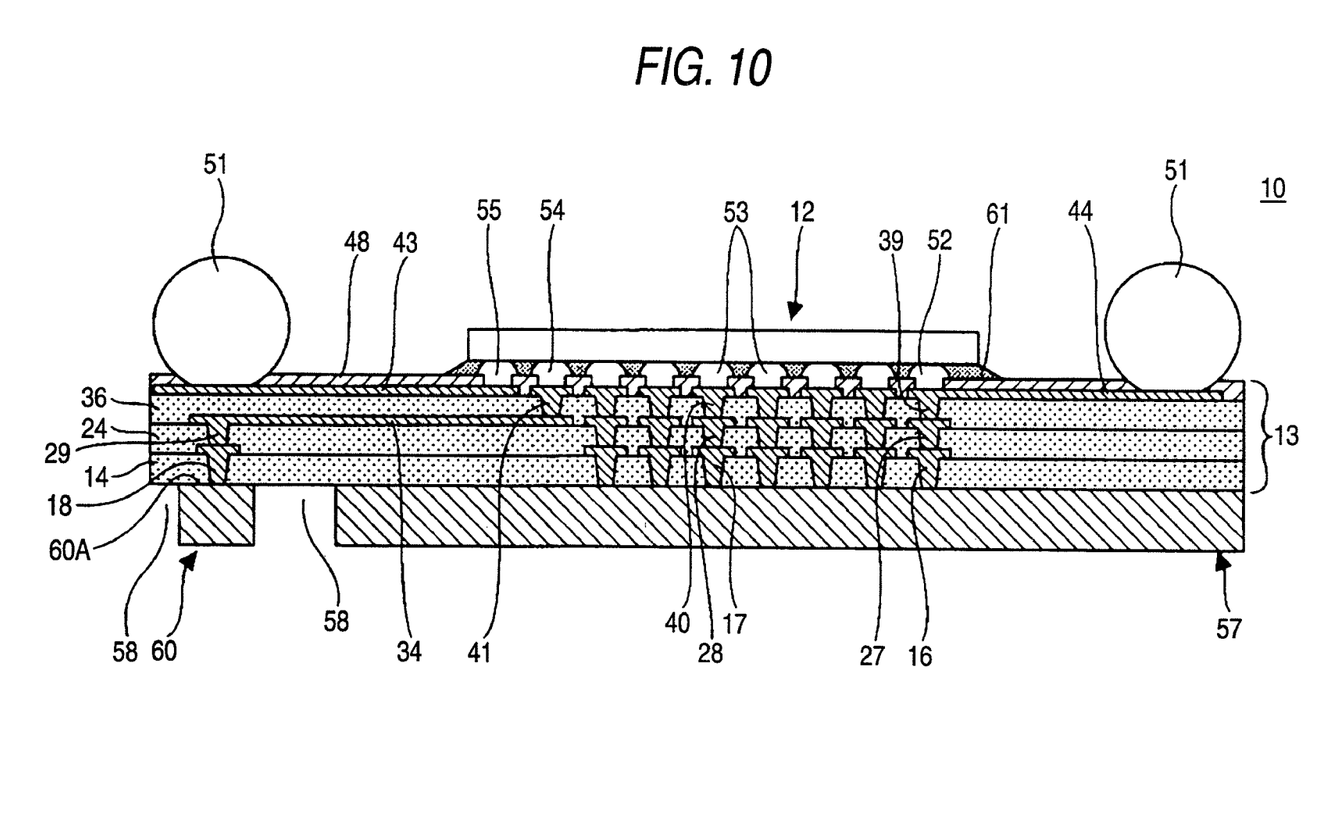
FIG. 10 is a view (No. 7) showing a step of manufacturing the semiconductor device according to the embodiment of the invention.

At a step shown in FIG. 10, next, the respective pads of an electronic component 12 are connected (flip-chip bonding) to the second external connecting terminals 52 to 55. Then, an underfill resin 61 is disposed between the wiring substrate 11 and the electronic component 12. Thereafter, first external connecting terminals 51 are provided in portions of the third wirings 43 and 44 of the wiring substrate 11 which are exposed from the protective film 48. Consequently, the electronic apparatus 10 including the wiring substrate 11 and the electronic component 12 is manufactured.

Figure 11:
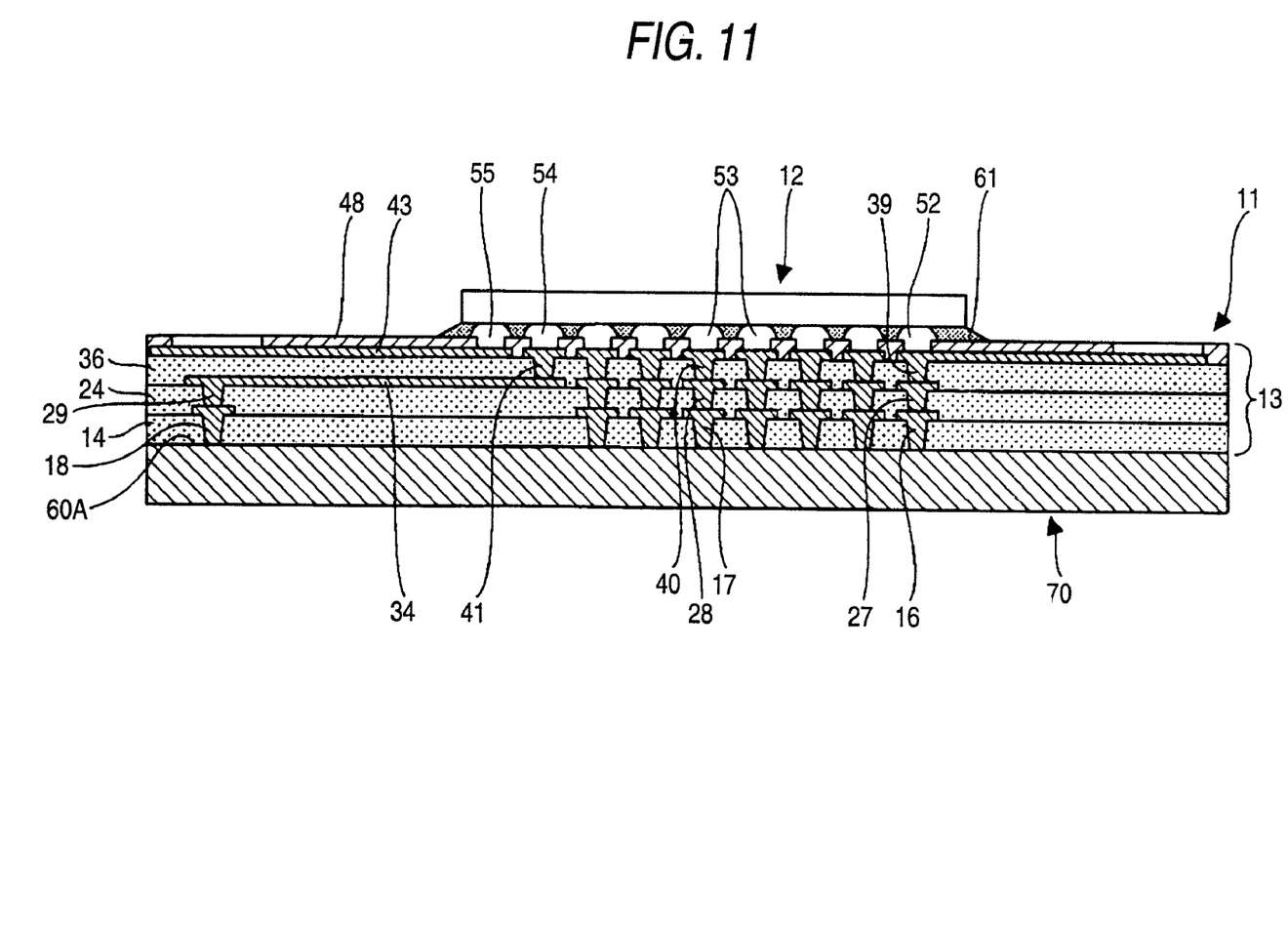
FIG. 11 is a view (No. 1) showing a step of manufacturing a semiconductor device according to a variant.
Figure 12:
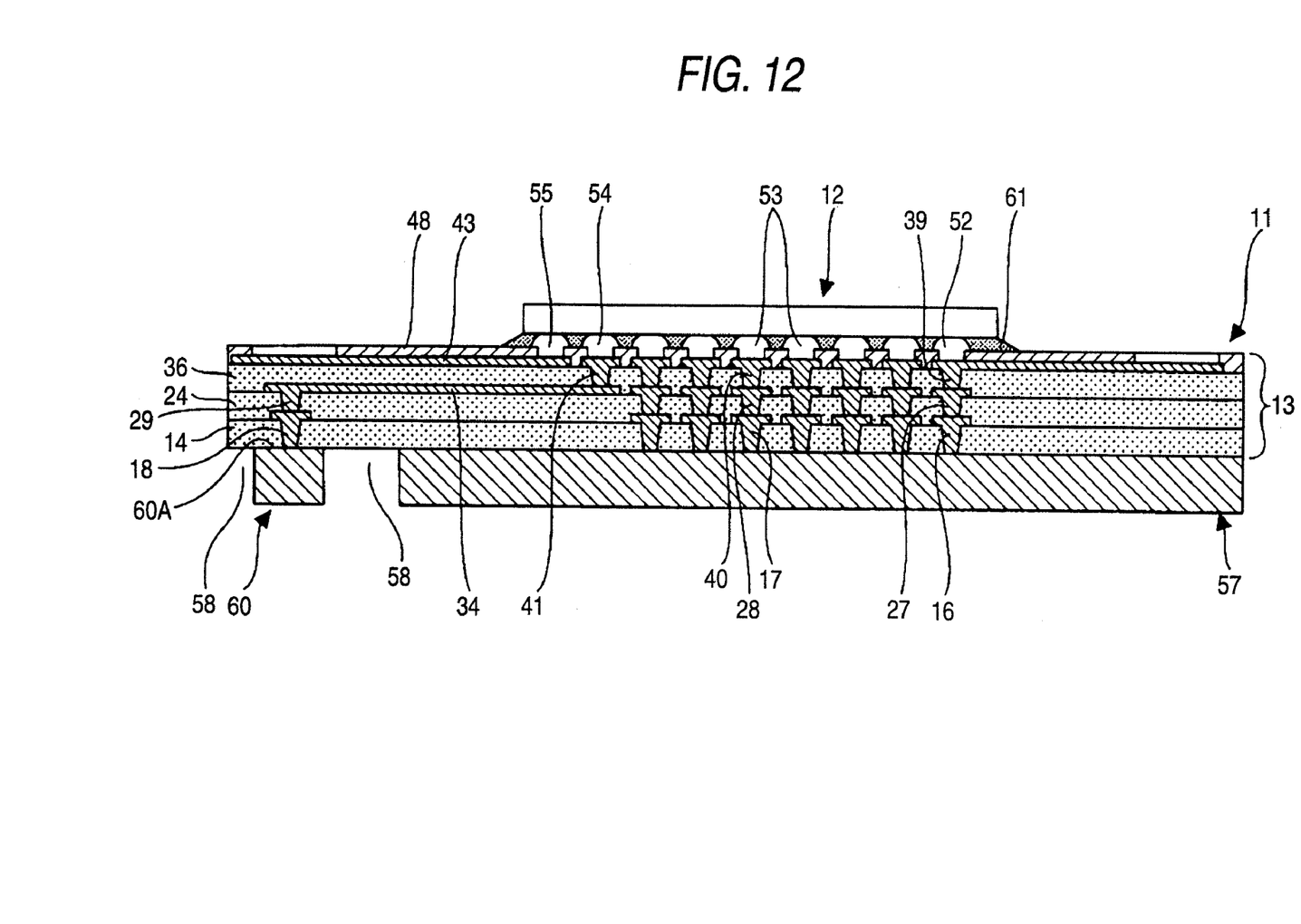
FIG. 12 is a view (No. 2) showing a step of manufacturing the semiconductor device according to the variant.
Figure 13:
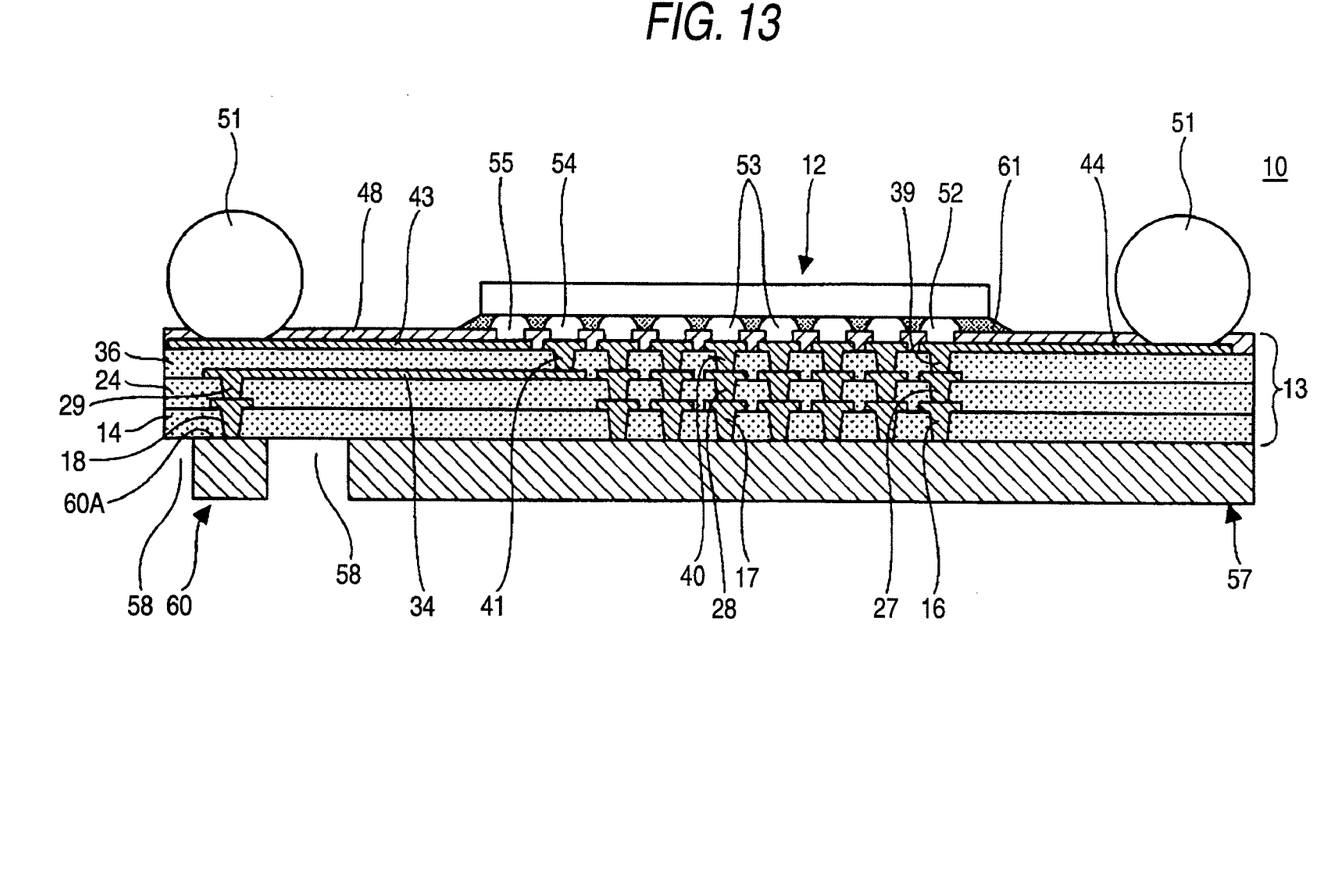
FIG. 13 is a view (No. 3) showing a step of manufacturing the semiconductor device according to the variant.

Next, description will be given to a variant of the embodiment. FIGS. 11 to 13 show a manufacturing method according to the variant of the embodiment. Since the manufacturing method according to the variant has identical manufacturing steps in FIG. 7 and therebefore to those of the manufacturing method according to the embodiment, manufacturing steps after FIG. 7 will be described.

When a multilayer wiring structure 13 is formed as shown in FIG. 7, an electronic component 12 is subsequently provided on the multilayer wiring structure 13 as shown in FIG. 11 in the variant. More specifically, second external connecting terminals 52 to 55 are first formed on connecting portions 43B, 44B, 45A and 46A, and respective pads of the electronic component 12 are connected (flip-chip connected) to the second external connecting terminals 52 to 55. Then, an underfill resin 61 is provided between a wiring substrate 11 and the electronic component 12.

At a step shown in FIG. 12, next, a removing portion 58 is formed on a metal plate 70 so that a radiating plate 57 and a dipole antenna 60 which have the planar shapes shown in FIG. 3 are formed at the same time (a metal plate processing step). The removing portion 58 can be formed by etching the metal plate 70 (wet etching or dry etching) in the same manner as in the embodiment. Also in the variant, the radiating plate 57 and the dipole antenna 60 are formed at the same time. Therefore, it is possible to decrease the number of the manufacturing steps and to reduce a cost.

Then, first external connecting terminals 51 are disposed in portions of third wirings 43 and 44 of the wiring substrate 11 which are exposed from a protective film 48. By the manufacturing method according to the variant, consequently, an electronic apparatus 10 including the wiring substrate 11 and the electronic component 12 is manufactured in the same manner as in the manufacturing method according to the embodiment.

While the description has been given by taking, as an example, the case in which the single multilayer wiring structure 13 is formed in the single metal plate 70 in the method of manufacturing a semiconductor device according to the embodiment, it is also possible to manufacture a plurality of electronic apparatuses 10 by forming a plurality of multilayer wiring structures 13 in the single metal plate 70, then mounting the electronic component 12 on each of the multilayer wiring structures 13 and thereafter cutting the metal plate 70.

Moreover, it is also possible to employ a method of disposing two metal plates 70 opposite to each other and bonding ends thereof with an adhesive, forming the multilayer wiring structure 13 in the two metal plates 70, then mounting the electronic component 12 on the multilayer wiring structure 13, thereafter separating the two metal plates 70, and subsequently forming the radiating plate 57 and the dipole antenna 60.

Although the description has been given by taking the dipole antenna 60 as an example of an antenna to be formed on the multilayer wiring structure 13 in the embodiment, furthermore, it is also possible to apply an antenna having another structure (for example, a patch antenna or an inverted F type antenna).

While the description has been given to the structure in which the first to third vias 17, 28 and 40 and the first to third wirings 21, 33 and 45 are used as the path for transferring a heat (the so-called thermal via) in the embodiment, moreover, it is also possible to employ a structure in which the path is earthed and thus serves as a ground.

What is claimed is:

1. An electronic apparatus comprising:
a multilayer wiring structure having an insulating layer and a wiring layer which are stacked;
an electronic component provided on one of the surfaces of the multilayer wiring structure;
a passive component formed on the other surface at an opposite side to the one of the surfaces of the multilayer wiring structure;
a radiating member formed on the other surface of the multilayer wiring structure and being spaced from the passive component such that the radiating member is not divided by the passive component and such that the passive component is not embedded in the radiating member; and
a radiating path formed in the multilayer wiring structure, having one end which is thermally connected to the radiating member, and the other end which is thermally connected to the electronic component.

2. The electronic apparatus according to claim 1, further comprising:
a thermal bump for radiation provided on the one of the surfaces of the multilayer wiring structure,
wherein the electronic component is thermally connected to the radiating path through the thermal bump for radiation.

3. The electronic apparatus according to claim 1, wherein the radiating member is ground connected.

4. The electronic apparatus according to claim 1, wherein the passive component is an antenna.

5. The electronic apparatus according to claim 2,
wherein the wiring layer includes a radiating wiring and a radiating via connected to the radiating wiring, the radiating wiring and the radiating via forming the radiating path,
wherein the radiating via is connected to the radiating member and the radiating wiring is connected to the thermal bump for radiation, and
wherein the thermal bump for radiation is connected to a dummy pad of the electronic component.

6. A method of manufacturing an electronic apparatus comprising:
a multilayer wiring structure forming step of sequentially providing an insulating layer, a wiring via and a wiring on a metal plate, thereby forming a multilayer wiring structure;
a metal plate processing step of patterning the metal plate to form a passive component; and
a mounting step of mounting an electronic component on a surface at an opposite side to a surface of the multilayer wiring structure on which the passive component is formed,
wherein a radiating via forming a radiating path is simultaneously formed together with the wiring and the wiring via at the multilayer wiring structure forming step, and
a radiating plate is simultaneously formed from the metal plate together with the passive component at the metal plate processing step, the radiating plate being spaced from the passive component such that the radiating plate is not divided by the passive component and such that the passive component is not embedded in the radiating plate.

7. The method of manufacturing an electronic apparatus according to claim 6, further comprising:
a thermal bump forming step of forming a thermal bump for radiation on the surface at an opposite side to a surface of the multilayer wiring structure on which the passive component is formed,
wherein the electronic component is thermally connected to the radiating path via the thermal bump at the mounting step.

8. A wiring substrate, comprising:
a multilayer wiring structure having an insulating layer and a wiring layer which are stacked and having one of the surfaces on which an electronic component is mounted;
a passive component formed on the other surface at an opposite side to the one of the surfaces of the multilayer wiring structure;
a radiating member formed on the other surface of the multilayer wiring structure and being spaced from the passive component such that the radiating member is not divided by the passive component and such that the passive component is not embedded in the radiating member; and
a radiating path formed in the multilayer wiring structure, having one end which is thermally connected to the radiating member, and the other end which is thermally connected to the electronic component.

9. The wiring substrate according to claim 8, wherein the radiating member is ground connected.

10. The wiring substrate according to claim 8, wherein the passive component is an antenna.

11. A method of manufacturing a wiring substrate comprising:
a multilayer wiring structure forming step of sequentially providing an insulating layer, a wiring via and a wiring on a metal plate, thereby forming a multilayer wiring structure; and
a metal plate processing step of patterning the metal plate to form a passive component,
wherein a radiating via forming a radiating path is simultaneously formed together with the wiring and the wiring via at the multilayer wiring structure forming step, and
a radiating plate is simultaneously formed from the metal plate together with the passive component at the metal plate processing step, the radiating plate being spaced from the passive component such that the radiating plate is not divided by the passive component and such that the passive component is not embedded in the radiating plate.

* * * * *